United States Patent
Mo et al.

(10) Patent No.: US 7,187,916 B2
(45) Date of Patent: Mar. 6, 2007

(54) METHOD AND SYSTEM FOR MEASURING RECEIVER MIXER IQ MISMATCH

(75) Inventors: Larry Y. L. Mo, San Ramon, CA (US); Akira Yamanaka, Union City, CA (US)

(73) Assignee: Broadcom Corporation, Irvine, CA (US)

( * ) Notice: Subject to any disclaimer, the term of this patent is extended or adjusted under 35 U.S.C. 154(b) by 392 days.

(21) Appl. No.: 10/774,116

(22) Filed: Feb. 6, 2004

(65) Prior Publication Data
US 2004/0219884 A1 Nov. 4, 2004

Related U.S. Application Data

(60) Provisional application No. 60/445,525, filed on Feb. 7, 2003.

(51) Int. Cl.
*H04B 1/40* (2006.01)
(52) U.S. Cl. ............... 455/323; 455/296; 455/324; 375/346
(58) Field of Classification Search ............. 455/296, 455/302–306, 67.11, 67.13, 78, 311–334; 375/346, 344, 345
See application file for complete search history.

(56) References Cited

U.S. PATENT DOCUMENTS

| | | | | |
|---|---|---|---|---|
| 5,249,203 A | * | 9/1993 | Loper | 375/344 |
| 5,604,929 A | * | 2/1997 | Loper et al. | 455/324 |
| 5,828,955 A | * | 10/1998 | Lipowski et al. | 455/324 |
| 6,670,900 B1 | * | 12/2003 | Zhang | 341/118 |
| 6,760,577 B2 | * | 7/2004 | Li | 455/323 |
| 6,842,489 B2 | * | 1/2005 | Masenten | 375/261 |
| 6,977,977 B1 | * | 12/2005 | Dubrovin et al. | 375/346 |
| 7,020,220 B2 | * | 3/2006 | Hansen | 375/324 |
| 2003/0223480 A1 | * | 12/2003 | Cafarella | 375/219 |
| 2004/0038649 A1 | * | 2/2004 | Lin et al. | 455/130 |
| 2005/0107059 A1 | * | 5/2005 | Lehning et al. | 455/303 |

* cited by examiner

*Primary Examiner*—Edward F. Urban
*Assistant Examiner*—Blane J. Jackson
(74) *Attorney, Agent, or Firm*—McAndrews, Held & Malloy, Ltd.

(57) ABSTRACT

Aspects for measuring receiver mixer IQ mismatch in a transceiver are described. The measuring includes providing a training signal for a receiver mixer, the training signal having periodic, uncorrelated I and Q signals. A phase mismatch in the receiver mixer is determined from IQ correlation over a unit period. A gain mismatch in the receiver mixer is determined from a power estimate of both I and Q signal for the unit period.

18 Claims, 2 Drawing Sheets

METHOD AND SYSTEM FOR MEASURING RECEIVER MIXER IQ MISMATCH

CROSS REFERENCE TO RELATED APPLICATIONS

The present application claims the benefit of U.S. Provisional Patent Application No. 60/445,525, filed Feb. 7, 2003, entitled, "Receiver IQ phase and gain mismatch digital calibration," which is incorporated herein by reference in its entirety.

FIELD OF THE INVENTION

The present invention relates to transceivers, and more particularly to estimating the receiver mixer IQ mismatch and digitally compensating the mismatch.

BACKGROUND OF THE INVENTION

One increasingly popular application for wireless systems are wireless local area networks (WLANs) of computer systems. Prominent in the field of home and business, wireless computer networks include the wireless standards known as 802.11. The first standard to be available in commercial products was 802.11b. However, increasing demand for higher capacity in the growing wireless LAN market has led to the introduction of a new generation of WLAN standards using more spectrally efficient modulation techniques, including the IEEE 802.11a standard. The 802.11a standard operates in the 5 GHz unlicensed national information infrastructure (UNII) band (5.15–5.35 GHz, 5.725–5.825 GHz) and is based on orthogonal frequency division multiplexing (OFDM). It supports data rates from 6 Mb/s to 54 Mb/s compared to 1 Mb/s to 11 Mb/s offered by 802.11b. The 802.11a operation around 5 GHz offers the additional advantage of less interference compared to the 2.4 GHz ISM band, where in addition to 802.11b, other band users include microwave ovens, cordless phones, Bluetooth systems, and vintage 802.11 systems.

The advantages of 802.11a come at a cost, however, as OFDM-based systems pose significant implementation challenges requiring low in-band phase noise, high linearity, accurate quadrature matching, closely matched frequency response between the I and Q signal paths, and a large dynamic range. "I" and "Q" are terms referring to "in-phase" and "quadrature," respectively. Ideally, the difference between I and Q signal paths in a transceiver is 90 degrees and the gain is 0 dB. I/Q mismatch refers to the difference in phase and gain between these paths. For example, in order to meet the transmitter error vector magnitude (EVM) specification for the 54 Mb/s mode with a 3 dB implementation margin, system simulation shows that an I/Q mismatch of 1.5 o/0.2 dB, an integrated phase noise error of 1 o rms and operation at 8 dB backoff from the transmitter 1 dB compression point are required.

In addition to tight performance constraints, pricing pressures require that wireless systems be low-cost and highly integrated implementations. To address these needs, the continuous trend towards low-cost integration of wireless systems has driven the introduction of innovative single-chip architectures in CMOS technologies as inexpensive alternatives to the traditional superheterodyne implementations operating at frequencies up to 5 GHz. Many of these single chip architectures are homodyne or direct conversion architectures, which have much fewer components than superheterodyne implementations. For example, in superheterodyne systems, the intermediate frequency (IF) must be high, so that the image is located far from the wanted signal in the frequency spectrum. However, since the IF frequency is high, the filtering of the desired channel (at IF) must also be done at the high frequency. It is difficult or impossible to implement such a filter as an integrated system, so external components are unavoidable. Direct conversion systems do not need such external components.

However, such highly-integrated direct-conversion single-chip architectures suffer from well-known shortcomings that may limit their applicability. These are problems that are also shared by other integrated architectures such as low-IF or wideband-IF, but which can be further aggravated by using CMOS technology.

For example, on the receiver side, the most common problem is the presence of DC offsets, both static and time-varying. In the 802.11a standard, even though a down-converted I/Q signal occupies bandwidth from 150 kHz to 8.3 MHz, the maximum 40 ppm frequency mismatch allowed between transmitter and receiver may shift the signal around DC, thus prohibiting AC coupling without using complex analog frequency correction techniques.

Static DC offset is the result of component mismatches in the signal path and local oscillator (LO) leakage at the inputs of the mixer and the low-noise amplifier (LNA) due to finite on-chip isolation. The leakage signal after mixing with the LO produces a DC component at the baseband input, which depends on the frequency and power of the LO signal. Since static DC offset may be large enough to saturate the baseband receive chain, it needs to be cancelled in the analog domain.

Time-varying DC offsets, in direct conversion receivers, can be the result of self-mixing due to leakage of single-tone (CW) or frequency modulated (FM) interference to the LO port. Similarly, second order distortion applied to CW or FM interference results in DC offset, which varies with the frequency and the power level of the received signal. Since strong interference is not usually present in the 802.11a operating bands, the dominant mechanism causing time-varying DC offsets is self-mixing of the LO signal leaking to the antenna and reflected back from the environment. At the 5 GHz carrier frequency, due to high attenuation and absorbency of reflected signals, such time-varying DC offsets are small compared to the static DC offsets and the overall dynamic range of the receiver (e.g., in the order of 10–50 mV for a 2Vp-p signal), thus it is well known that the time-varying offsets can be tracked and removed by digital signal processing (DSP) after analog-to-digital conversion.

Direct down/up-conversion from/to 5 GHz requires quadrature LO generation at the RF carrier frequency which may result in large I/Q mismatches (including gain and phase mismatches). Other significant problems include sensitivity to flicker noise and pulling of the voltage-controlled oscillator (VCO) by the external or on-chip power amplifier (PA). In addition to these architecture-related non-idealities, higher order QAM-OFDM modulation requires tightly matched baseband I/Q filters on both transmit and receive side to avoid degradation of the overall EVM.

For a spectrum efficient modulation such as QAM64, precise IQ path matching is required for both phase and gain A phase mismatch of a few degrees or a gain mismatch of 1 db would have a significant impact on the overall performance of the communication system. Achieving such a high matching by analog design and manufacturing technology is not easy, becuase of limited manufacturing accuracy.

Accordingly, what is needed is an efficient way to digitally measure the receive path IQ mismatch, estimate the mismatch as a calibration process and then to digitally compensate it. The present invention addresses such needs.

SUMMARY OF INVENTION

The present invention provides a method and system for measuring receiver mixer IQ mismatch in a transceiver. The measuring includes providing a training signal for a receiver mixer, the training signal having periodic, uncorrelated I and Q signals. A phase mismatch in the receiver mixer is determined from IQ correlation over a unit period. A gain mismatch in the receiver mixer is determined from a power estimate of both I and Q signal for the unit period.

DETAILED DESCRIPTION OF PREFERRED EMBODIMENTS

The present invention relates to estimating the receiver mixer IQ mismatch and digitally compensating the mismatch. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

Embodiments and examples of the present invention are described below. While particular applications and methods are explained, it should be understood that the present invention can be used in a wide variety of other applications and with other techniques within the scope of the present invention.

Figure 1:
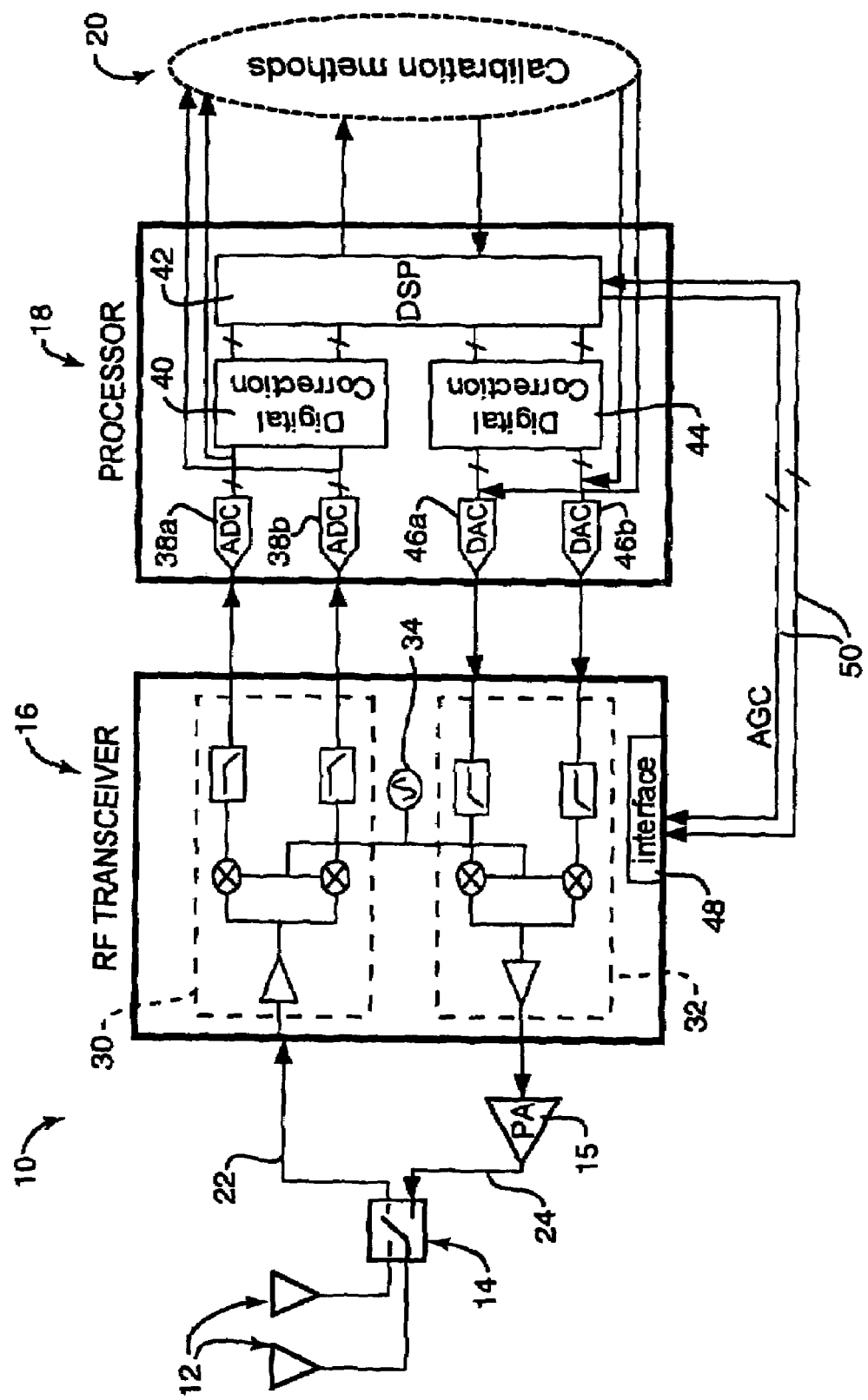
FIG. 1 is a block diagram illustrating an overall system architecture for a direct conversion transceiver and calibration processor of the present invention.

FIG. 1 is a block diagram of an overall system architecture 10 for the present invention. System 10 includes one or more antennas 12, a transfer switch 14, a radio frequency (RF) transceiver 16, a companion baseband processor 18, and calibration methods 20.

Antennas 12 are used to receive a transmitted signal from the air, and to transmit a signal to this air channel. For example, in a wireless LAN environment, a different computer may be transmitting data via wireless transmission, which is then received by one or more antennas 12. Or, the computer to which the antennas 12 are coupled can transmit a signal via antennas 12, which is received by a different antenna, computer or device. Other types of wireless devices can also use one or more antennas 12 which are also suitable for use with the present invention. A transfer switch 14 can be coupled to the antennas 12 and is used to switch between an input port 22 and an output port 24. The transfer switch 14 can be a double-pole double-throw (DPDT) switch, or a combination of switches or switches and diodes performing the same functionality. Typically, the received signal is filtered by one or more radio frequency (RF) filters (not shown) before being provided at the receiver input 12.

The input 22 and output 24 are connected to RF transceiver 16 of the present invention, which includes a receiver component 30, a transmitter component 32, and a frequency synthesizer 34. The receiver component 30 receives the signals from the antennas 12 and processes the signals to allow the desired data to be retrieved from the signals. Processing includes frequency translation to a low intermediate frequency (IF) or baseband, and filtering of unwanted interference from the useful signal. The transmitter component 32 converts a signal formulated by the baseband processor 18 (or other processor) to a form in which it can be transmitted by the antennas 12. Frequency synthesizer 34 generates the reference frequency (LO) signals needed for modulation and demodulation in the transceiver 16. In one described embodiment, transceiver 16 is provided on a single integrated circuit chip, an integrated solution allowing it to be cheaply manufactured. RF transceiver 16 is described below in greater detail with respect to FIG. 2.

In one application for the present invention, transceiver 16 can be implemented as a direct conversion radio transceiver. This embodiment can implement the radio part of the PHY (physical) layer for an 802.11a WLAN system, for example, or other wireless LAN or communication system. For example, CMOS can be used for a single-chip implementation. Many of the problems that typically apply to integrated CMOS or other similar integrated technology in direct conversion high frequency transceiver applications are minimized in the present invention through the use of calibration techniques and overall system design.

Baseband processor 18 is coupled to RF transceiver 16. Processor 18 can be any type of processor, including a microprocessor, application-specific integrated circuit (ASIC), or other type of controller. Processor 18 can be a general purpose processor that performs other tasks and functions for the device in which the system 20 is included in addition to the functions needed for the present invention. For example, processor 18 can be a controller or processor in a wireless network card, or a general microprocessor in a computer that includes a wireless network card using the present invention. Alternatively, processor 18 can be specifically provided for the present invention, and in some embodiments can be included with transceiver 16, e.g. on the same integrated circuit chip. One important feature of some embodiments of the present invention is that the functionality of the processor 18 needed for the present invention can be implemented using free resources of an existing processor, such as a host processor, and has little impact on the computational resources of such a processor.

An important function of the processor 18 for the present invention is the compensation of non-idealities of the transceiver 16 using computing resources of the processor 18. The baseband processor 18 receives a down-converted received signal from the receiver component 30 of the transceiver 16, where the signal has been separated into its in-phase (I) and quadrature (Q) forms. The received signal is provided to analog-to-digital converters (ADCs) 38a and 38b, where ADC 38a receives the I signal and ADC 38b receives the Q signal.

The digital outputs of the ADCs 38a and 38b are provided to a digital correction block 40, which performs real-time I/Q mismatch correction (post-distortion) by using the coefficients computed.

The digital correction block 40 provides the I and Q data to a digital signal processor (DSP) 42, which performs the rest of the functionality of the PHY and MAC (media access control) communication layers (e.g., communicating with other processors and/or functions of a host computer or device. This functionality can be implemented entirely within the DSP processor 42, be partitioned between a processor (such as an ASIC) and a general processor, or reside totally in a general (e.g., host) processor. The DSP 42 can be a processor on the processor chip 18, or some other processor used to implement the calibration methods described herein. In receive mode, DSP 42 receives corrected digital data from the digital correction block 40, representing signals received by the transceiver 16, for digital demodulation for recovery of the original bits of information.

In transmit mode, when the DSP 42 has data to be transmitted, the data is corrected in correction block 44, which performs real-time I/Q mismatch correction (pre-distortion) by using the coefficients (calibration parameters) computed during an initial calibration cycle.

Correction block 44 sends the I data to digital-to-analog controller (DAC) 46a and sends the Q data to DAC 46b. DACs 46a–b convert the digital data into I and Q analog signals which are provided to the transmitter 32 of transceiver 16. In one embodiment, DACs 46a–b can be dual 10-bit 40 MHz DACs, but may be any suitable type in other embodiments.

DSP 42 also provides programming signals 50 for the RF transceiver 16, which can include (but are not limited to) real time automatic gain control (AGC) signals, and signals for programming the frequency synthesizer 34, programming the correction DC offset for the DC offset correction DACs 120 and 122 of the receiver (see FIG. 2), programming the cutoff for the analog filters 132, 134, 210, 212 (see FIG. 2), and programming the chip into different states or calibration modes. In the described embodiment, a digital interface 48 of the transceiver 16 receives these signals which can include, for example, a 7-bit AGC control line and a 3-wire interface for all other programming as well as real-time signals for receiver and transmitter switching. The programming signals 50 allow the processor 18 to control loop-back paths on the transceiver 16 so that the processor can send signals (stimuli) to the transceiver and to receive responsive signals from the transceiver based on the signals, i.e., as if the transceiver has received the signals wirelessly. This enables the measurement of analog imperfections of the transceiver 16 and allows the processor 18 to make adjustments, also using the programming signals 50, to components in the transceiver to minimize or compensate for problems, such as I/Q mismatches, baseband filter cutoff frequency mismatch, DC offset, etc. The programming signals 50 can control the calibration paths needed for DC offset calibration, filter tuning, I/Q mismatch calibration, and LO leakage calibration, and can also be used for tuning of the frequency synthesizer 34. For example, processor 18 preferably has the capability of real-time digital pre-distortion and post-distortion in blocks 44 and 40, respectively, which is needed for compensation of transmitter and receiver I/Q mismatch and transmitter local oscillator (LO) leakage.

Baseband processor 18 can be implemented in a variety of different embodiments. The functions of processor 18 shown in FIG. 1 are common in many types of microprocessors and other types of processors, or can exist in specialized processors (e.g., ASICs), such as for wireless LAN applications in such an embodiment.

Methods 20 calibrate the transceiver 16 by measuring characteristics of transceiver components based on received signals by and computing the necessary correction parameters to correct any analog imperfections in the circuits. These methods can be implemented by the processor 18 in some embodiments (such as by DSP 42), for example as program instructions or code (software or firmware) stored in memory or other storage device (magnetic disk, CD-ROM, etc.), or by hardware (logic gates, etc.), or by a combination of hardware and software. In other embodiments, the methods can be implemented and performed by a general purpose processor, such as the host processor of a computer that includes a network card or component holding the system 20, or by a different processor in communication with the processor 18 or transceiver 16.

The present invention thus enables the correction for nonidealities in the analog front-end of a transceiver by using overall system resources and achieves performance adequate to support high bit rate modulation schemes. In some embodiments, aspects of the present invention can also be used in non-direct-conversion transceivers, as appropriate.

Figure 2:
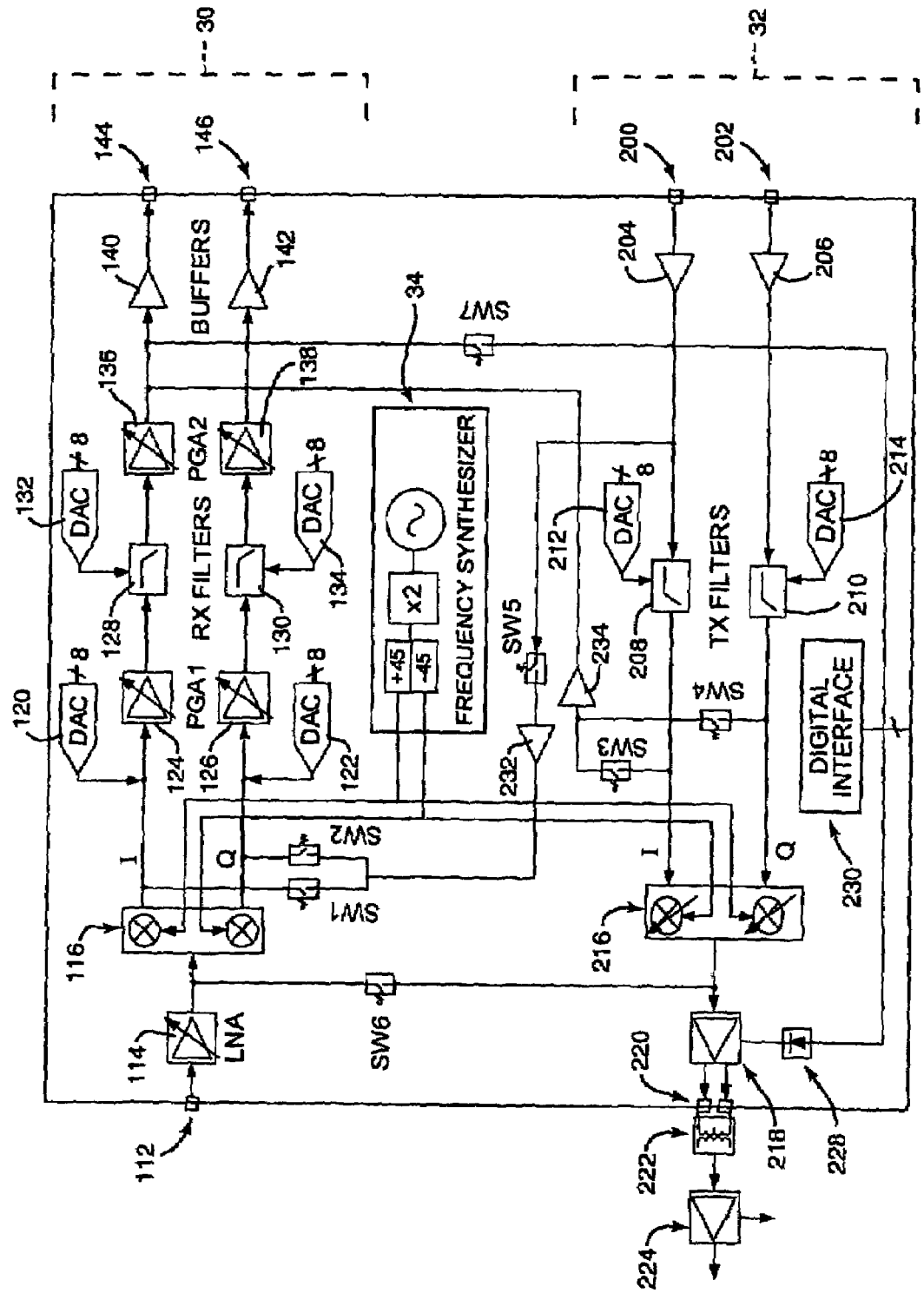
FIG. 2 is a block diagram illustrating the transceiver of the present invention.

FIG. 2 is a schematic diagram illustrating one embodiment of the transceiver 16 of the present invention. As described above, transceiver 16 includes a receiver 30, a transmitter 32, and a frequency synthesizer 34. Both transmitter and receiver components preferably use direct conversion and employ fully differential signal paths to minimize crosstalk and externally induced noise.

Receiver

The receiver 30 includes a receiver input 112, which provides a signal received by the transceiver 16 from the antenna 12. The signal is preferably in differential form to reduce second order distortion and minimize substrate and supply coupling, such that positive (P) and negative (N) terminals are used; however, signals in other forms can be used with the present invention in alternate embodiments.

The received signal is sent from the input 112 to a low noise amplifier (LNA) 114, which amplifies the received signal. The LNA has sufficient gain to provide a signal having a high enough amplitude for use in the receiver while introducing little noise to the signal.

The amplified signal from LNA 114 is provided to a quadrature demodulator 116, which downconverts the high frequency signal directly into the baseband frequency. The quadrature demodulator 116 includes two mixers in the described embodiment. The quadrature demodulator 116 receives a reference (LO) signal at a desired frequency from a frequency synthesizer 34 The demodulator 116 separates the received passband signal into two baseband differential signals, one In-phase (I) and one Quadrature (Q).

The quadrature demodulator 16 can introduce DC offset to the signal. Large DC offset can corrupt a weak signal or saturate the baseband circuits, programmable gain amplifiers (PGAs) 124 and 126, filters 128 and 130, etc. The overall receive chain path DC offset is calculated and is real-time corrected (adaptively cancelled) at the output of the mixers of the quadrature demodulator 116 by two independent 8-bit current steering digital-to-analog converters (DACs) 120 and 122. DAC 120 corrects the DC offset on the I path of the demodulator 116, and DAC 122 corrects the DC offset on the Q path of the demodulator 116, by adding a small DC voltage (relative to the DC voltage level) to the signal at the output of the demodulator 116 and input to the PGA 124 or 126.

The baseband path of the receiver includes components of amplifiers, filters, and output buffers on the I and Q paths. The baseband path can include different components in other embodiments; a direct-conversion baseband path, in general, performs filtering and variable gain.

Digitally programmable gain amplifiers (PGAs) 124 and 126 receive the outputs of the demodulator 116 on the I and Q paths, respectively. PGA 124 can employ, for example, a low-noise, high dynamic range single-stage amplifier with a resistive attenuator at its input, but can be other types of programmable amplifiers in alternate embodiments. The gain of the PGA 124 and 126 is programmable by a digital word provided by the baseband processor 18, e.g., via the AGC programming bus 50. Other embodiments can also be used, such as variable gain amplifiers (VGAs) controlled by an analog voltage.

Low pass filters 128 and 130 receive the output of the corresponding PGA 124 or 126 on the I and Q paths, respectively, and perform baseband channel selection. In one embodiment, a fourth order Chebyschev filter can be used for each filter 128 and 130; however, any filter can be used which can be tuned by a voltage or by a digital word. The response of each filter 128 and 130 can be tuned to a desirable cutoff frequency and bandwidth by the DC voltage Vc generated by DACs 132 and 134, respectively. The DACs are controlled by signals from the processor 18 to enable the receive filters to be tightly matched in their responses with each other.

After the low pass filters 128 and 130, two secondary PGAs 136 and 138 are employed, where PGA 136 is used on the I path, and PGA 138 is used on the Q path. In the described embodiment, each PGA 136 and 138 is an operational amplifier-based feedback gain stage; other types of amplifiers can be used in other embodiments. To achieve optimum noise/linearity performance, the two PGAs 124 and 136 (or 126 and 138) are located before and after the channel-select filter 128 (or 130). In one example of the described embodiment, the composite gain of the amplifiers along a path (I or Q) can vary from 2 dB to 53 dB, programmable in 3 dB steps by an external 6-bit word provided by the processor 18. In general, PGAs 124/126 and 136/138 perform gain control. In other embodiments, the PGAs 124/126 and/or 136/138 can be merged with the filters 128 and 130 rather than being provided as separate components. Or, only one PGA (or other type of variable gain or fixed amplifier) can be after the filter or before the filter; or, one fixed amplifier is provided before and a variable gain amplifier after (or vice versa), etc.

An output buffer 140 and 142 is employed at each of the I and Q paths, respectively, after the PGAs 136 and 138. The outputs of the buffers 140 and 142 are provided at receiver outputs 144 and 146 of the transceiver 16, where each path provides a differential signal having positive and negative components. The signals from these receiver outputs are provided to processor 18 as explained above with respect to FIG. 1.

Transmitter

The transmitter 32 of transceiver 16 is a direct conversion, up-conversion transmit path and includes transmitter inputs 200 and 202. The inputs 200 and 202 receive a signal from the baseband processor 18 which has formulated the analog signal that is to be upconverted and transmitted by the transceiver 16. For example, in the described embodiment, the transmit path input analog signal is provided by DACs 46a and 46b located at the processor 18, as described above with respect to FIG. 1. The signal is preferably in the form of I and Q signals, where input 200 receives the I signal, and input 202 receives the Q signal. Furthermore, each I and Q signal path is preferably provided in differential form, such that positive (P) and negative (N) terminals are used by each.

The I and Q signals to be transmitted are sent from the inputs 200 and 202 to input buffers 204 and 206, respectively. From the outputs of the buffers 204 and 206, the I and Q signals are sent to transmit baseband filters 208 and 210, respectively. These filters are low pass filters, e.g., they can be the same or similar to the filters 128 and 130 used in the receiver of the transceiver 16 as described above. Similarly to the low pass filters of the receiver, the responses of the transmit filters 208 and 210 can be preferably tuned to the desirable cutoff frequency and bandwidth by the DC voltage Vc generated by 8-bit DACs 212 and 214, respectively. In other embodiments, variable gain stages can be included before, after, or merged with the filter.

The outputs of the filters 208 and 210 provide the filtered I and Q signals to a programmable gain modulator (PGM) 216. In other embodiments the modulator 216 can be fixed gain. The PGM 216 up-converts the I and Q pathways to a single transmit path at the desired RF carrier frequency, i.e., the mixer modulates the baseband signals directly into the high frequency signal. Similar to the quadrature demodulator 116, the PGM 216 receives a reference (LO) signal at a desired frequency from frequency synthesizer 34. PGM 216 utilizes two mixers.

The output of the I and Q mixers in the PGM 216 is summed in order to drive the RF output amplifier. Gain programmability of the PGM 216 is achieved by adjusting the input transconductance stage using a switchable resistive ladder at the input of the mixers. In one example embodiment, the modulator 216 provides 27 dB of gain control in 3 dB steps.

The output of the PGM 216 is preferably a fully differential signal path, but in alternate embodiments can take other forms. The differential output of the PGM 216 is amplified by an RF output driver amplifier 218, also preferably differential. In the described embodiment, the driver amplifier 218 can be a single stage cascoded differential pair, inductively degenerated to improve linearity. In other embodiments, amplifier 218 can have variable programmable gain. The RF amplifier amplifies the signal from the modulator 216 to deliver the signal to the antenna 12. The signal can be then sent to an external power amplifier, can be first filtered first and then delivered to an external power amplifier, or can be filtered and delivered to the antenna, e.g., via the switch 14.

The output of the driver amplifier 218 is converted to a single-ended signal (in most embodiments) via a balanced-to-unbalanced converter (BALUN) or transformer 222, the output of which is then applied to the input of an external power amplifier (PA) 224. In the described embodiment, the amplifier 224 and transformer 222 are shown located off of the chip of the transceiver 16 and receiving the signal via the output 220 of the chip; however, the amplifier 224 and/or transformer 222 be located on the chip in other embodiments.

Envelope detector 228 has an input connected to the driver amplifier 218 for receiving the output RF transmit signal and detects an envelope of the signal, e.g. amplitude demodulates the signal. The detector 228 has an output connected to the I path of the receiver 30 after PGA 136 via switch SW7. When SW7 is enabled ("closed") then the envelope detector 228 is connected to the I channel and provides the envelope of the transmitted signal to the analog I output of the receiver and thus to processor 18. This signal path is active in calibration mode, when the transmit I/Q mismatch and LO leakage are measured. When SW7 is inactive ("open"), then the envelope detector 228 is not in use. Envelope detector 228 can be included on the chip of the transceiver 16, or be made external to the transceiver chip. Also, in other embodiments, detector 228 can be located after the PGM 216 or after the PA 224, or can be part of the PA 224.

A number of "loop-back" switches are provided in the transceiver 16. The switches allow desired feedback or loopback paths of the transceiver 16 to be selected to be active so that calibration can occur.

Switches SW1, SW2, and SW5 enable measurement of frequency response of the receiver baseband filters. Switches SW3 and SW4 similarly enable measurement of the frequency response of the transmitter baseband filters 208 and 210, which can then be digitally calibrated to the desired cutoff by DACs 212 and 214.

Switches SW6 and SW7 are used for transmitter and receiver I/Q mismatch measurement. When switch SW7 is closed and the other switches open, the RF output of the transmitter is output from driver 218, through the envelope detector 218 to the I-path at the receiver output, through the receiver buffer 140, and back to processor 18. This allows a calibration waveform sent to the transmitter to be amplitude demodulated by the envelope detector, bypass the receiver, and fed back to the processor 18, where the envelope of the RF signal is digitized by the ADC 38a of the processor 18. The detected envelope is used to jointly measure transmitter I/Q mismatch and LO leakage. Alternatively, the calibration path of SW7 can go to any other dedicated pin or connection that can be received and digitized by the processor, or to any other point of the baseband receive chain, I or Q, as long as there is a way for the baseband processor 18 to read the information.

Switch SW6 enables a feedback loop between the transmitter and the receiver. When switch SW6 is closed (and all others open), a path is formed from the output of PGM 216 on the transmitter to the input of the quadrature demodulator 116 of the receiver. Thus a calibration waveform can be sent from the transmitter 32 to the front of the receiver 30, to be received by processor 18 through the receiver. The received waveform can be used in measuring receiver I/Q mismatch, as described in more detail hereinbelow.

Digital interface 48 provides the interface to the transceiver 16 to allow the control/programming signals from the processor 18 to power up or down different sections of the transceiver, e.g., to make sure that, in various calibration modes, different sections of the transceiver are powered up and down (the components/sections powered up are generally those where the signal passes through or necessary for signal passage). Interface 48 also allows the signals from processor 18 to operate control circuitry on the transceiver, such as the DACs 120, 122, 132, 134, 212 and 214, and the control switches (described above) to create the necessary loopback paths. The digital interface 48 can send commands that are decoded in the transceiver (by logic, etc.) which sends the appropriate control signals or digital words to the switches, DACs, etc., and to power up and down different sections.

Receiver IQ Mismatch Measurement

In accordance with a preferred embodiment of the present invention, receiver I/Q mismatch is measured by the processor 18. Switch SW6 is closed while other switches remain open to make the receiver mismatch measurement loopback connection active. The transmitter circuit generates RF training signals just like during an ordinary data transmission. The RF signals are then fed to the receiver mixer. They travel through regular receiver signal path until they are measured by the I and Q ADCs 38a and 38b. To distinctly estimate the receiver mixer IQ mismatch, the transmitter mixer mismatch and other IQ mismatch has to be accurately matched. By way of example, an envelope of a transmitted calibration signal is measured for leakage of the LO signal of the frequency synthesizer 34 and for transmitter I/Q mismatch. To do this in the described embodiment, switch SW7 is closed while the other switches remain open to make the appropriate loopback connection active, and a calibration waveform is sent to the transmitter 32 so that the envelope of the waveform, provided by envelope detector 228, is digitized by ADC 38a of the processor 18. Methods for envelope detection of a simple waveform, measurement of LO leakage and transmit I/Q mismatch from the envelope, and determination of calibration parameters for the leakage and transmit I/Q mismatch are well known, e.g., in J. K. Cavers, "New methods for adaptation of quadrature modulators and demodulators in amplifier linearization circuits," *IEEE Transactions on Veh. Technology*, vol. 46, no. 3, pp. 707–716, August 1997.

In a preferred embodiment, the training signal from the transmitter that is used for the receiver mixer IQ mismatch has the following characteristics: I and Q signals are periodical and uncorrelated. These features are necessary for a simple and accurate estimation, and combined with the estimation algorithm, the estimation becomes insensitive from phase rotation between the transmitter and receiver mixers, which could introduce estimation error or require a more complicated estimation calculation. Further, with these features for the estimation, the phase mismatch can be simply calculated from IQ correlation taken over the unit period, while the gain mismatch can be simply calculated from the power estimate of both of I and Q for the unit period.

In a further embodiment, the estimation could operate in an iterative fashion. One of the advantage of the iterative estimation is that it lifts the small mismatch requirements the estimation algorithm has. As it operates as an iterative way naturally the residual mismatch becomes smaller, and it very quickly satisfies the small mismatch requirements. Hence, it gives an accurate estimate. This iterative estimation can be done in two ways:

1) By using a pre-compensated signal as a measurement signal, it can estimate the residual of the receiver mixer IQ mismatch.

2) By performing post-correction using the latest available correction parameter and applying the algorithm on the post-corrected signals to further estimate the residual mismatch. This mismatch value is again iteratively used to further perform the post-correction and so on. Mismatch compensation can be performed by a matrix multiplication. One of the cross term can be set to zero by further applying a certain rotation, which has no impact for demodulation performance.

In measuring the receiver mixer IQ mismatch, a system description for a small mismatch case can be given as:

$$\begin{pmatrix} I' \\ Q' \end{pmatrix} = \begin{pmatrix} 1+g & f \\ f & 1-g \end{pmatrix} \begin{pmatrix} \cos\theta & -\sin\theta \\ \sin\theta & \cos\theta \end{pmatrix} \begin{pmatrix} I \\ Q \end{pmatrix}$$

This computes to:

$I' = \{f \cdot Q + (1+g) \cdot I\} \cos\theta + \{f \cdot I + (1+g) \cdot Q\} \sin\theta$ $Q' = \{f \cdot I + (1-g) \cdot Q\} \cos\theta + \{-f \cdot I + (1-g) \cdot I\} \sin\theta$ If a correlation is taken between I' and Q' for the unit period the following can be shown:

$$\sum_{period} I' \cdot Q' = f \cdot \left\{ \sum_{period} I^2 + \sum_{period} Q^2 \right\} = f \cdot \text{Power}$$

where $\text{Power} = \sum_{period} \{I^2 + Q^2\}$

For the above, the second order terms in terms of 'f' and 'g' are ignored.

Thus, the correlation does not depend on 'θ' but only on 'f' and power, and the IQ phase mismatch parameter 'f' can be calculated as follows.

$$f = \frac{\sum_{period} I' \cdot Q'}{\text{Power}}$$

Similarly a power for i and Q over the unit period may be calculated as:

$$\sum_{period} I'^2 = \{1 + 2 \cdot g\} \cdot \text{Power}$$

$$\sum_{period} Q'^2 = \{1 - 2 \cdot g\} \cdot \text{Power}$$

Again, the I' and Q' power does not depend on 'θ' but only on 'g' and power. Thus, the IQ gain mismatch parameter 'g' can be calculated as follows.

$$g = \frac{\sum_{period} I'^2 - \sum_{period} Q'^2}{4 \cdot \text{Power}}$$

Digital pre-distortion or post distortion can be done as follows using the calculated parameters when 'f' and 'g' are small.

$$\begin{pmatrix} I' \\ Q' \end{pmatrix} = \begin{pmatrix} 1+g & f \\ f & 1-g \end{pmatrix} \begin{pmatrix} I \\ Q \end{pmatrix}$$

In general, especially when the mismatch is large, the digital pre-distortion or post-distortion becomes a general matrix multiplication:

$$\begin{pmatrix} I' \\ Q' \end{pmatrix} = \begin{pmatrix} a & b \\ c & d \end{pmatrix} \begin{pmatrix} I \\ Q \end{pmatrix}$$

By introducing an iterative correction and estimation procedure, the correction parameters 'a', 'b', 'c' and 'd' can be accurately acquired. The procedure of the estimation is:

1) Calculate the post-distorted I' and Q' signals using the latest available digital compensation parameters.
2) Apply the algorithm over these I' and Q'
3) Estimate the latest mismatch parameters
4) Calculate the updated compensation parameters The following provides a more particular example of the estimation implementation. As far as I and Q signals are uncorrelated and periodic, with a same power any signals would work. One example for such signals is the shorter preamble sequence used in 802.11a standard. The following is the code for the generation of the signal, sig(1:16):

```
S53=[0,0,1+j,0,0,0,-1-j,0,0,0,1+j,0,0,0,-1-j,0,0,0,-1-j,0,0,0,
     1+j,0, 0,0,0,0,-1-j,0,0,0,-1-j,0,0,0,1+j,0,0,0,1+j,0,0,0,1+j,
     0,0,0,1+j,0,0];
S53=S53*sqrt(13/6.);
sx(1:27)=S53(27:53);
sx(39:64)=S53(1:26);
yx=ifft(sx);
sig=yx(1:16);
```

From the measured I and Q signals, rxI(1:LEN), rxQ(1:LEN), the phase mismatch can be calculated as follows:

```
pow=sum(abs(complex(rxI,rxQ)).^2);
ccorr=sum(rxI.*rxQ);
f=-2*ccorr/pow;
```

From the measured I and Q signals, rxI(1:LEN), rxQ(1:LEN), the gain mismatch can be calculated as follows:

```
powI=sum(rxI.^2);
powQ=sum(rxQ.^2);
g=(powQ-powI)/2/(powI+powQ);
```

The codes for the digital pre-distortion or post-distortion would be:

```
I=(1+g)*I+f*Q;
Q=f*I+(1-g)*Q;
```

The following provides an example of entire algorithm implementation using an iterative algorithm:

```
alph=0.6;
beta=0.6;
a=1;b=0;c=0;d=1;
for I=1:Iter
    rxIcorr=a*rxI+b*rxQ;
    rxQcorr=c*rxI+d*rxQ;
    pow=sum(abs(complex(rxIcorr,rxQcorr)).^2);
    ccorr=sum(rxIcorr.*rxQcorr);
    f=-2*alph*ccorr/pow;
    powI=sum(rxIcorr.^2);
    powQ=sum(rxQcorr.^2);
    g=beta*(powQ-powI)/2/(powI+powQ);
    a=a*(1+g)+c*f;
    b=b*(1+g)+d*f;
    c=a*f+c*(1-g);
    d=b*f+d*(1-g);
end
```

Here, 'alph' and 'beta' is a parameter introduced for the stability. The finally obtained parameters 'a', 'b', 'c' and 'd' are the parameters to be used for the digital corrections.

Through the present invention, the training signal used for the receiver mixer IQ mismatch provides I and Q signals that are periodical and uncorrelated. In this manner, a simple and accurate estimation is achieved, that remains substantially insensitive to phase rotation between the transmitter and receiver mixers. Further, with these features for the estimation, the phase mismatch can be simply calculated from IQ correlation taken over the unit period, while the gain mismatch can be simply calculated from the power estimate of both of I and Q for the unit period. Additionally, the estimation is capable of operating in an iterative fashion.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for measuring receiver mixer IQ mismatch in a transceiver, the method comprising:
   providing a training signal for a receiver mixer, the training signal having periodic, uncorrelated I and Q signals;
   determining a phase mismatch in the receiver mixer from IQ correlation over a unit period; and
   determining a gain mismatch in the receiver mixer from a power estimate of both I and Q signals for the unit period.

2. The method of claim 1 wherein providing a training signal comprises closing an RF signal path between a transmitter and the receiver mixer and generating the training signal with the transmitter.

3. The method of claim 1 comprising estimating the IQ mismatch iteratively.

4. The method of claim 3 comprising utilizing a pre-compensated signal as a measurement signal for the iterative estimation.

5. The method of claim 3 comprising performing post-correction using a latest available correction parameter and estimating residual mismatch from post-correction signals.

6. The method of claim 1 comprising utilizing matrix multiplication to perform mismatch compensation.

7. A system for estimation of receiver mixer IQ mismatch during signal modulation, the system comprising
   a transceiver, the transceiver including a transmitter and a receiver, the transmitter providing a training signal for a receiver mixer, the training signal having periodic, uncorrelated I and Q signals; and
   a processor coupled to the transceiver, the processor determining a phase mismatch in the receiver mixer from tO correlation over a unit period, and determining a gain mismatch in the receiver mixer from a power estimate of both I and Q signals for the unit period.

8. The system of claim 7 wherein the transmitter provides a training signal on a closed an RF signal path between the transmifter and the receiver mixer.

9. The system of claim 7 wherein the processor estimates the IQ mismatch iteratively.

10. The system of claim 9 wherein the processor utilizes a pre-compensated signal as a measurement signal for the iterative estimation.

11. The system of claim 9 wherein the processor performs post-correction using a latest available correction parameter and estimates residual mismatch from post-correction signals.

12. The system of claim 7 wherein the processor utilizes matrix multiplication to perform mismatch compensation.

13. A method for measuring receiver mixer IQ mismatch in a transceiver, the method comprising:
   utilizing a transmitter to provide a training signal for a receiver mixer, the training signal having periodic, uncorrelated I and Q signals; and
   utilizing a processor to determine a phase mismatch in the receiver mixer from IQ correlation over a unit period, and to determine a gain mismatch in the receiver mixer from a power estimate of both I and Q signals for the unit period.

14. The method of claim 13 wherein utilizing a transmitter comprises generating the training signal with the transmitter on a closed RF signal path between a transmitter and the receiver mixer.

15. The method of claim 13 wherein utilizing a processor comprising utilizing the processor for estimating the IQ mismatch iteratively.

16. The method of claim 15 comprising utilizing a pre-compensated signal as a measurement signal for the iterative estimation.

17. The method of claim 15 comprising performing post-correction using a latest available correction parameter and estimating residual mismatch from post-correction signals.

18. The method of claim 13 comprising utilizing the processor for matrix multiplication to perform mismatch compensation.

* * * * *

UNITED STATES PATENT AND TRADEMARK OFFICE
CERTIFICATE OF CORRECTION

PATENT NO. : 7,187,916 B2 Page 1 of 1
APPLICATION NO. : 10/774116
DATED : March 6, 2007
INVENTOR(S) : Larry Y. L. Mo and Akira Yamanaka It is certified that error appears in the above-identified patent and that said Letters Patent is hereby corrected as shown below:

Claim 8 Column 13, line 43, after the word "closed", delete the word "an".

Signed and Sealed this

Fifteenth Day of May, 2007

JON W. DUDAS
*Director of the United States Patent and Trademark Office*